(12) United States Patent
Wong et al.

(10) Patent No.: US 9,117,843 B2
(45) Date of Patent: Aug. 25, 2015

(54) DEVICE WITH ENGINEERED EPITAXIAL REGION AND METHODS OF MAKING SAME

(75) Inventors: King-Yuen Wong, Hsin-Chu (TW); Chia-Yu Lu, Hsin-Chu (TW); Chien-Chang Su, Kaohsiung (TW); Yen-Chun Lin, Hsin-Chu (TW); Yi-Fang Pai, Hsin-Chu (TW); Da-Wen Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 550 days.

(21) Appl. No.: 13/232,738

(22) Filed: Sep. 14, 2011

(65) Prior Publication Data

US 2013/0062670 A1   Mar. 14, 2013

(51) Int. Cl.
   *H01L 21/336*   (2006.01)
   *H01L 29/66*   (2006.01)
   *H01L 21/8238*   (2006.01)
   (Continued)

(52) U.S. Cl.
   CPC ...... *H01L 29/66636* (2013.01); *H01L 21/8249* (2013.01); *H01L 21/823807* (2013.01); *H01L 21/823814* (2013.01); *H01L 29/0847* (2013.01); *H01L 29/165* (2013.01); *H01L 29/7834* (2013.01); *H01L 29/7848* (2013.01)

(58) Field of Classification Search
   CPC ............ H01L 21/0245; H01L 21/02636; H01L 21/02639; H01L 21/02647; H01L 21/31604; H01L 21/823412; H01L 21/823418; H01L 21/823807; H01L 21/823814; H01L 29/045; H01L 29/0847; H01L 29/1033; H01L 29/1054; H01L 29/517; H01L 29/66318; H01L 29/665; H01L 29/66651; H01L 29/66636; H01L 21/66477; H01L 29/78; H01L 29/7848; H01L 29/78618

USPC ......... 438/142, 151, 153, 154, 169, 180, 181, 438/187, 188, 197, 198, 229, 230, 286, 299, 438/301, 303, 706; 257/288, 577, 586, 592, 257/593, E29.255, E21.109, E21.1, 257/E21.102, E21.106, E21.11, E21.128, 257/E51.038, E23.117

See application file for complete search history.

(56) References Cited

U.S. PATENT DOCUMENTS 5,162,884 A * 11/1992 Liou et al. ............... 257/384
5,416,736 A * 5/1995 Kosa et al. ............... 365/174

(Continued)

OTHER PUBLICATIONS

Kim, H.S., et al., "High Performance Device Design through Parasitic Junction Capacitance Reduction and Junction Leakage Current Suppression beyond 0.1 μm Technology," Jpn. J. Appl. Phys., vol. 42, Part 1, No. 4B, Apr. 2003, pp. 2144-2148.

*Primary Examiner* — Kyoung Lee
*Assistant Examiner* — Joannie A Garcia
(74) *Attorney, Agent, or Firm* — Slater & Matsil, L.L.P.

(57) ABSTRACT

An engineered epitaxial region compensates for short channel effects of a MOS device by providing a blocking layer to reduce or prevent dopant diffusion while at the same time reducing or eliminating the side effects of the blocking layer such as increased leakage current of a BJT device and/or decreased breakdown voltage of a rectifier. These side effects are reduced or eliminated by a non-conformal dopant-rich layer between the blocking layer and the substrate, which lessens the abruptness of the junction, thus lower the electric field at the junction region. Such a scheme is particularly advantageous for system on chip applications where it is desirable to manufacture MOS, BJT, and rectifier devices simultaneously with common process steps.

20 Claims, 4 Drawing Sheets

(51) Int. Cl.
  *H01L 21/8249*  (2006.01)
  *H01L 29/78*   (2006.01)
  *H01L 29/08*   (2006.01)
  *H01L 29/165*  (2006.01)

(56) References Cited

U.S. PATENT DOCUMENTS

| | | | | |
|---|---|---|---|---|
| 5,439,832 | A * | 8/1995 | Nakamura | 438/192 |
| 8,361,872 | B2 * | 1/2013 | Cai et al. | 438/303 |
| 2002/0167045 | A1 * | 11/2002 | Short | 257/330 |
| 2005/0026342 | A1 * | 2/2005 | Fung et al. | 438/197 |
| 2005/0184311 | A1 * | 8/2005 | Murthy et al. | 257/197 |
| 2005/0184335 | A1 * | 8/2005 | Gi Lee | 257/327 |
| 2005/0215018 | A1 * | 9/2005 | Hao et al. | 438/302 |
| 2006/0226476 | A1 | 10/2006 | Suenaga | |
| 2006/0237746 | A1 | 10/2006 | Orlowski et al. | |
| 2006/0249788 | A1 * | 11/2006 | Blanchard | 257/341 |
| 2008/0023752 | A1 * | 1/2008 | Chen et al. | 257/327 |
| 2008/0157091 | A1 * | 7/2008 | Shin et al. | 257/66 |
| 2009/0134470 | A1 * | 5/2009 | Yang | 257/369 |
| 2010/0163983 | A1 * | 7/2010 | Choi | 257/336 |
| 2010/0197092 | A1 | 8/2010 | Kim et al. | |
| 2010/0276761 | A1 * | 11/2010 | Tung et al. | 257/384 |
| 2011/0006367 | A1 * | 1/2011 | Fuller et al. | 257/347 |
| 2012/0056275 | A1 * | 3/2012 | Cai et al. | 257/402 |
| 2012/0135575 | A1 * | 5/2012 | Wong et al. | 438/289 |
| 2013/0032814 | A1 * | 2/2013 | Bour et al. | 257/76 |

* cited by examiner

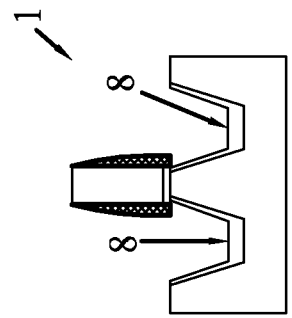
Figure 1
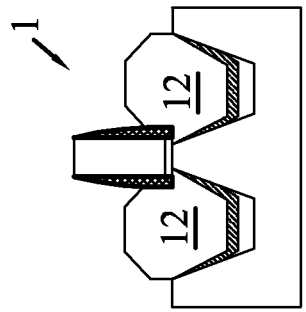
Figure 1a
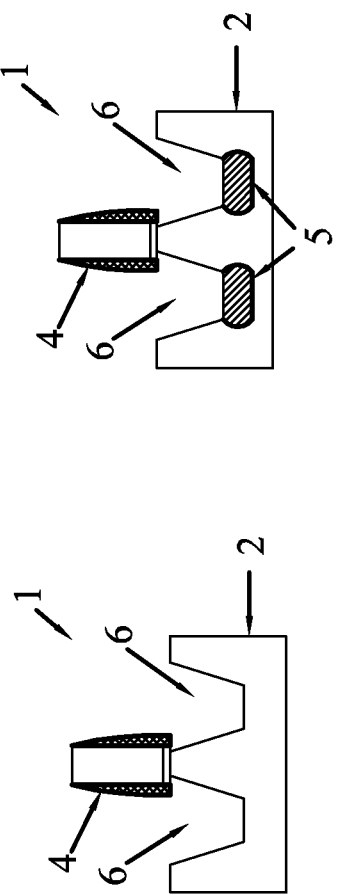
Figure 2
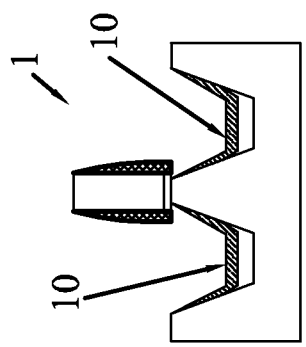
Figure 3
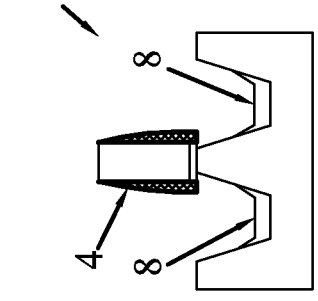
Figure 4
Figure 5

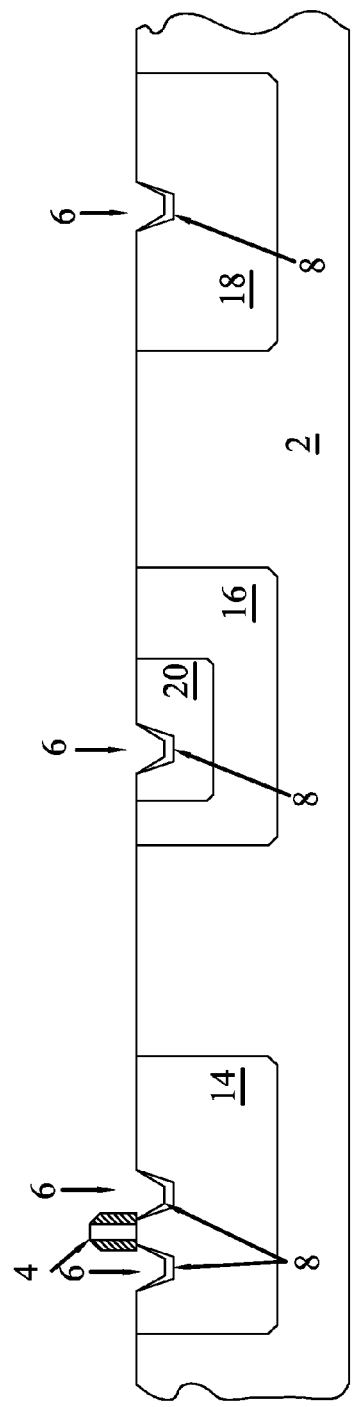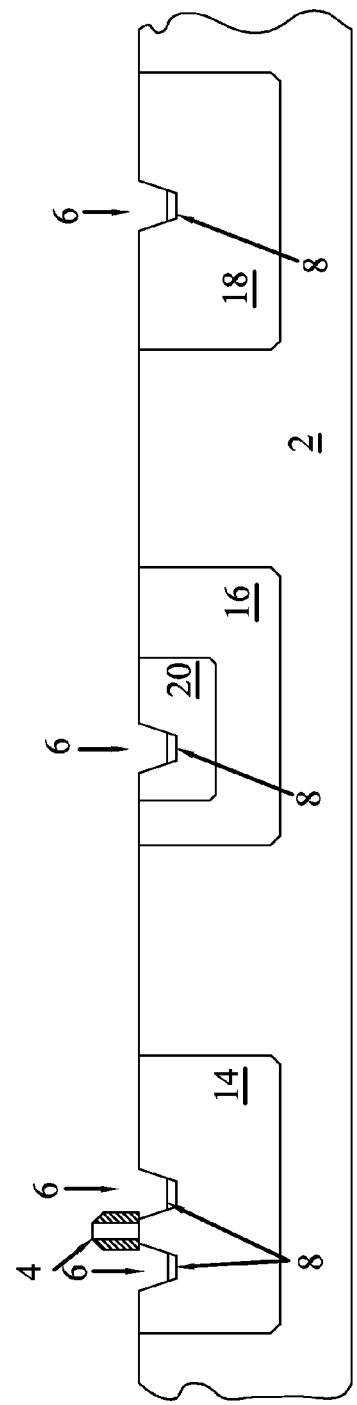

DEVICE WITH ENGINEERED EPITAXIAL REGION AND METHODS OF MAKING SAME

BACKGROUND

System on chip (SOC) applications frequently require CMOS devices to be manufactured on a same wafer as devices such as bipolar junction transistors (BJTs) and rectifiers. Each of these types of device has unique performance constraints and trade-offs. While it is desirable to manufacture such devices simultaneously, and typically using the same process steps, steps to improve the performance of one type of device, e.g. a CMOS transistor, may lead to degraded performance of other devices, such as a BJT. What is needed then is manufacturing structures and methods having improved performance for different types of devices.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 through 5 illustrate steps in the manufacture of illustrative embodiments of the present invention; and FIGS. 6 through 11 illustrate steps in the manufacture of an illustrative system on chip embodiments of the present invention.

DETAILED DESCRIPTION OF ILLUSTRATIVE EMBODIMENTS

Figure 6:
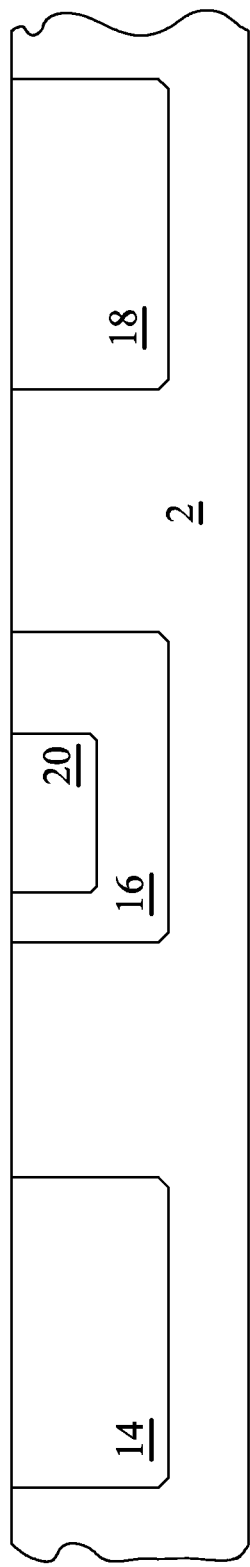

Referring first to FIG. 1, an illustrative device 1 in an intermediate stage of manufacture is illustrated. Device 1 is manufactured in and on a substrate 2. Although only a single device 1 is illustrated in FIG. 1, one skilled in the art will recognize that multiple devices (not illustrated) will be simultaneously formed on the substrate. These devices can include one or more CMOS transistors, one or more BJTs, one or more rectifiers, as well as other devices, such as integrated capacitors, inductors, resistors, and the like, as well as appropriate metallization and/or conductor layers for electrical interconnection of the various active and passive devices. In the embodiment illustrated in FIG. 1, the device 1 is a CMOS transistor (although device 1 is shown in an intermediate stage of manufacture and hence does not include all the elements of the finished CMOS transistor).

Substrate 2 may be a bulk substrate, such as a silicon or other semiconductor material wafer, or substrate 2 may be a semiconductor layer formed atop a composite wafer, such as a silicon-in-insulator (SOI) or similar such composite wafer. In the intermediate stage illustrated in FIG. 1, as gate structure 4 has been manufactured on a top surface of substrate 2. Gate structure 4 is fabricated using well-known fabrication techniques which, for the purposes of clarity and brevity, and not repeated here. It should be noted that gate structure 4 may be an operational structure that will form part of the resulting device, or alternatively, gate structure 4 may be a so-called dummy structure that will be subsequently removed from the device and replaced with an actual operational gate structure, as is known in the art.

Recesses 6 have been formed in substrate 2. In the case of a silicon wafer 2, recesses 6 may be formed using, e.g., a $Cl_2$ dry etch process, as an example, or other known alternatives. In an illustrative embodiment, recesses 6 are formed to a depth that is appropriate for a desired device geometry. As one example, in a device manufactured using 20 nm geometry, recesses 6 may be formed to a depth of from about 100 Å to about 300 Å and in some embodiments from about 200 Å to about 250 Å, for example. Other methods for forming and other geometries for recesses 6 will be apparent to those skilled in the art, and are within the contemplated scope of the present invention.

FIG. 1a illustrates an optional, although preferred, embodiment wherein a gradient implant region 5 is formed in substrate 2 below recesses 6. Gradient implant region 5 is formed by ion implantation to form a region having a graded dopant concentration. This graded dopant concentration reduces the high electrical field that would otherwise exist at the abrupt junction between substrate 2 and source-drain dopant-rich layer. As such, gradient implant region 5 reduces the leakage current of the resulting device. However, in device scaling, the gradient implant has not a common window for the optimization of junction leakage and punch-through. Thus, the proposed structure consists of dopant-rich layer 8, which compensates the halo dopant to reduce the junction field, and blocking layer 10 retarding the lateral dopant diffusion. Because gradient implant region 5 is not necessary for explaining the present invention, it will not be shown in the remaining figures.

FIG. 2 illustrates a subsequent step in the process, wherein a dopant-rich layer 8 is formed along the sidewalls and the bottom of recesses 6. In an illustrative embodiment wherein substrate 2 is silicon, dopant-rich layer comprises silicon that is in situ doped during the formation process. As an example, dopant-rich layer 8 might be in situ doped with phosphorous for a nominal impurity concentration of between about $3E^{20}$ atoms/cm$^3$ and $8E^{20}$ atoms/cm$^3$. One skilled in the art will recognize numerous alternatives and modifications, once informed by the present disclosure. By way of example and not by limitation, such modifications could include that dopant-rich layer 8 comprises antimony, arsenic, or other well known dopants. The dopant concentration can be varied, depending upon the desired application and device performance requirements. While dopant-rich layer 8 is disclosed as a doped silicon layer formed in a silicon substrate, one skilled in the art would recognize that substrate 2 and/or dopant-rich layer 8 could comprise germanium, SiGe, a III-V material, or the like.

In one embodiment, dopant-rich layer 8 may be in situ phosphorous doped silicon that is deposited using a Metal Organic Chemical Vapor Deposition (MOCVD) process. Other epitaxial growth processes could be employed. The growth rate of dopant-rich layer 8 is dependent upon the crystal orientation of the underlying substrate upon which the layer is grown. For instance, in one illustrative embodiment, the respective bottoms of trenches 6 might have a crystal orientation (100) and the sidewalls might have a crystal orientation of (111) or (110). Dopant-rich layer 8 will grow at a faster rate on the bottom or recesses 6 (relative the sidewalls) because of the of different crystal orientations—resulting in the structure shown in FIG. 2, wherein dopant-rich layer 8 is formed on the bottoms of recesses 6 to a thickness of perhaps about 50 Å to about 100 Å. At the same time, dopant-rich layer 8 is formed on the sidewalls of recesses 6 to a thickness of only perhaps about 20 Å to about 40 Å.

In a subsequent step, as illustrated by FIG. 3, dopant-rich layer 8 is substantially removed from the sidewalls of recesses 6. This is accomplished, for instance, by employing a wet or dry etch process using HCl, for instance. As but one example, etching can be accomplished by, for example, $GeH_4$ or $Cl_2$ etch gas at a flow rate of from about 70 sccm to about 700 sccm, a temperature of from about 500 C to about 700 C, and a pressure of from about 15 to 350 torr. In some embodiments, GeH$_4$ may be included in the etch chemistry to further improve the etching characteristics. One skilled in the art will recognize that the etch process is also dependent upon crystal orientation and that the dopant-rich layer 8 on the sidewalls of recesses 6 will etch away more quickly than will the dopant-rich layer 8 on the bottoms of recesses 6 or that the isotropic etching removes the thickness of dopant-rich layer on the sidewall and bottom. As a result, after the etch step, dopant-rich layer 8 remains on the bottoms of recesses 6 (because of the thicker bottom thickness) but is entirely or substantially removed from the sidewalls of recesses 6. After the etch process, dopant-rich layer 8 remains at the bottoms of recesses 6 to a thickness of perhaps about 20 Å to about 50 Å. In some embodiments, the etch step may occur in a same chamber in which dopant-rich layer 8 is epitaxially grown.

FIG. 4 illustrates a next step in the process, wherein a blocking layer 10 is formed along the sidewalls of recesses 6 and atop dopant-rich layer 8 remaining on the bottoms of recesses 6. In illustrative embodiments, blocking layer 10 comprises an epitaxially grown in situ carbon doped silicon layer, SiC. The SiC is lattice mismatched to the substrate itself, but the results of defect induced leakage current will be negligible—particularly as the SiC is grown to such a thin layer. To the extent stress is induced, it will be tensile stress which will improve NFET performance, albeit to a minor degree. In illustrative embodiments, blocking layer comprises from about 0.5% to about 1% carbon. Blocking layer 10 may be formed using a MOCVD process in the same chamber as was used to form dopant-rich layer 8, in some embodiments. Because the crystal orientation of substrate 2 will carry forward in dopant-rich layer 8, blocking layer 10 will grow faster on dopant-rich layer 8 (having crystal orientation of (100)), than it will grow on sidewalls 6 (having crystal orientation of (111) or (110)). In an illustrative embodiment, blocking layer 10 is grown to a thickness of about 70 Å on the bottoms of recesses 6 (i.e. on dopant-rich layer 8) and to a thickness of about 30 Å on the sidewalls of recesses 6. An appropriate thickness for a given application can be determined as a matter of routine experimentation.

Blocking layer 10 can be doped with other impurities in some embodiments. For instance, blocking layer 10 could be in situ doped with carbon, germanium, xenon, and the like.

FIG. 5 illustrates device 1 after recesses 6 have been filled with epitaxially grown material 12, such as in situ phosphorous doped silicon in the illustrated embodiment. In the illustrated embodiments, recesses 6 are over filled with epitaxially grown material 12, which material will act as the source/drain regions for CMOS device 1. Epitaxially grown material 12 may also be referred to herein as source/drain regions. In the illustrated embodiments, epitaxially grown material 12 is formed in a same chamber as is employed for forming dopant-rich layer 8 and blocking layer 10—such as an MOCVD deposition chamber. In some embodiments, source/drain regions 12 are doped to a similar concentration as is dopant-rich layer 8, i.e. from about 3E20 to about 8E20 atoms/cm$^3$. Other dopant concentrations for the source/drain regions 12 are also within the contemplated scope of the invention.

Turning now to FIG. 6, another embodiment is disclosed wherein different devices can be manufactured simultaneously using common processes. As an example, FIG. 6 illustrates a substrate 2 wherein a first region 14, a second region 16, and a third region 18 are illustrated. First region 14 could be, for instance, a p-well in which an n-type MOS transistor will be formed. Second region 16 could be, for instance, an n-well in which a bipolar junction transistor will be formed, having formed therein a p-well 20. Third region 18 could be, for instance, an n-well in which a rectifier will be formed. As shown, a fourth region is illustrated within region such as for instance a p-well formed within the n-well.

Figure 7:
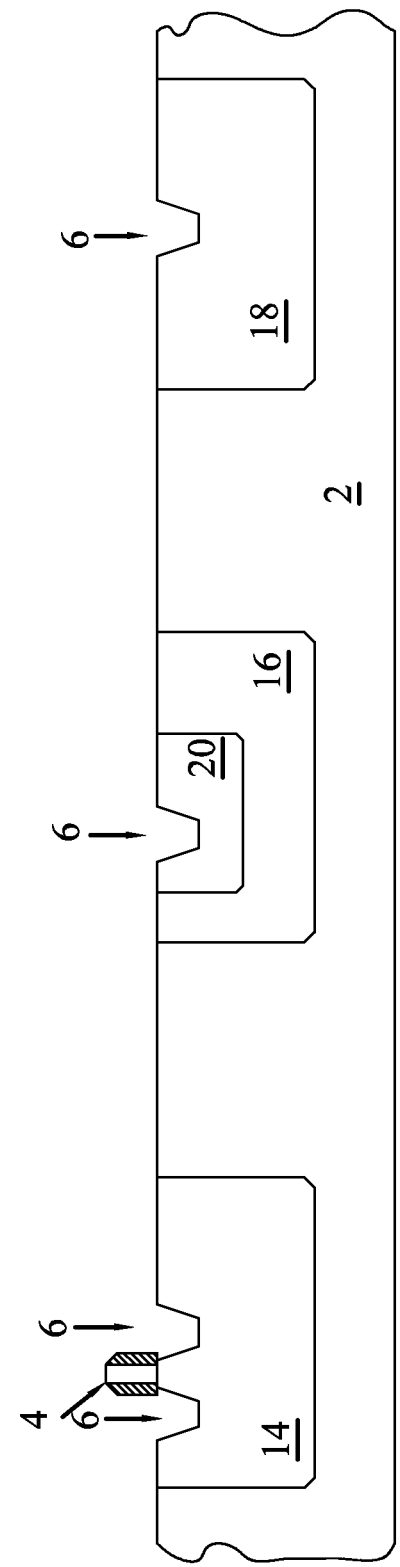

As shown in FIG. 7, recesses 6 are formed within the regions 14, 16, and 18, respectively. Recesses 6 formed in first region 14 will be used for forming source/drain regions for the resulting MOS transistor, as will be further explained below. Likewise, recess 6 formed in second region 16 will be used for forming a n-type emitter region for the subsequently formed BJT transistor. Further likewise, recess 6 formed in third region 18 will be used for forming a n-type region of the subsequently formed rectifier. Also shown in FIG. 7 is that gate structure 4 is formed above first region 14. The details of the steps for forming gate structure 4 are omitted herefrom as those details are not necessary for an understanding of the present invention.

As was described in detail with reference to the embodiment illustrated in FIGS. 1 through 5, dopant-rich layer 8 is formed within each of the recesses in regions 14, 16, and 18. This is illustrated in FIG. 8. Although not illustrated in FIG. 8, it should be understood that a gradient implant region (such as gradient implant region 5 illustrated in FIG. 1a) may be formed below at least the recesses formed in first region 14. A similar gradient implant region 5 could likewise be formed below the recesses formed in second region 16 and/or third region 18.

Figure 10:
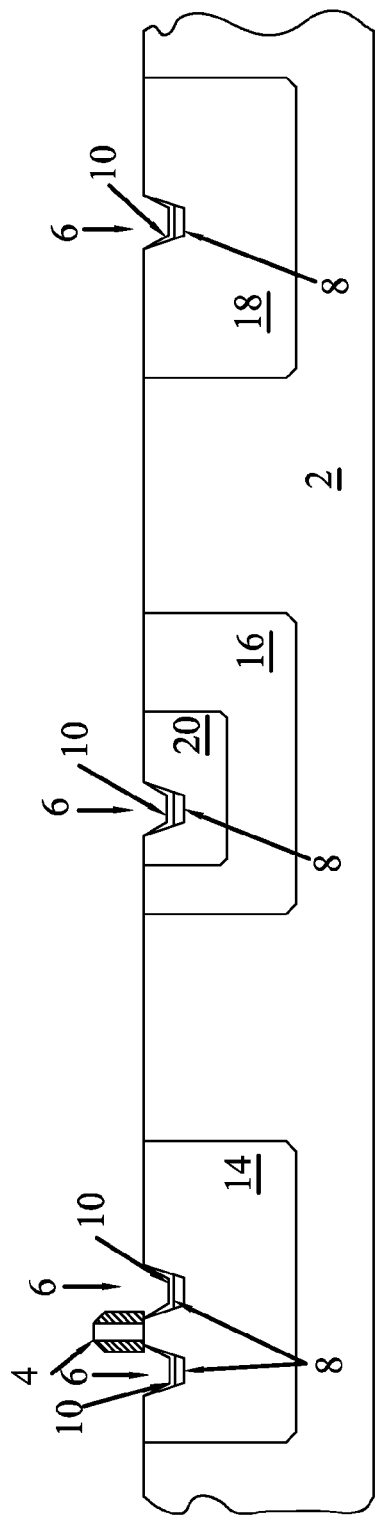
Figure 11:
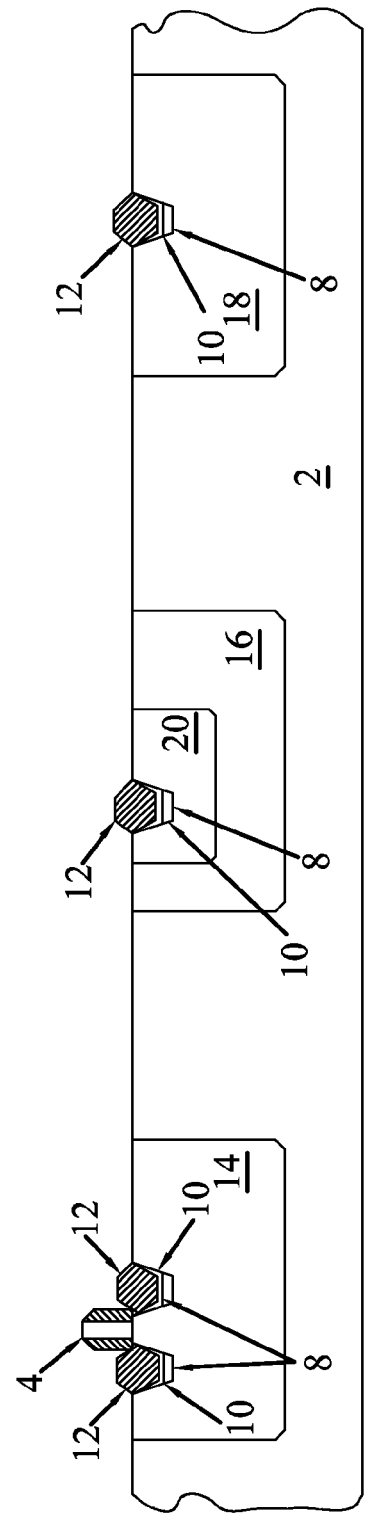

Dopant-rich layer 8 is selectively or isotropically etched from sidewalls of recesses 6 while remaining on the respective bottoms of recesses 6, resulting in the structure illustrated in FIG. 9. The details of this etch process may be similar to the details provided above with respect to FIG. 3. Processing proceeds with the formation of blocking layer 10 in the recesses, such as illustrated in FIG. 10, followed by formation of epitaxially grown material 12 in the remaining portions of the respective recesses 6. Epitaxially grown material 12 forms the source/drain regions in first region 14, forms an n-type emitter region for an n-p-n BJT transistor in second region 16, and forms an n-type region in a p-well for the rectifier in region 18, as illustrated in FIG. 11.

Blocking layer 10 advantageously reduces or prevents the diffusion of phosphorous impurities from source/drain regions 12 (aka epitaxially grown material 12 in first region 14). This helps to prevent or reduce the so-called short channel effects and punch through phenomenon that may result when phosphorous (or other dopant) impurities encroach upon the channel region of the MOS device. On the other hand, blocking layer 10 causes an abrupt junction with the p-well in which it is formed. This results in a high electric field at the junction, which increases leakage current of the resulting MOS device. The abrupt junction likewise increases the base width and hence the amount of base recombination for the resulting BJT device, which lowers the device gain. Additionally, the abrupt junction caused by the (carbon-doped) blocking layer will cause a lower breakdown voltage for the resulting rectifier device, arising from the high electric field at the junction.

The advantageous feature of the blocking layer can be obtained, while reducing or eliminating the undesirable consequences, by employing the dopant-rich layer 8 as described above. This is because the dopant-rich layer 8 by being interposed between blocking layer 10 and the underlying well region, makes for a less abrupt junction. Thus leakage current is reduced for the MOS device, base width is lessened and hence current gain is increased for the BJT device, and breakdown voltage is increased for the rectifier, all by the introduction of dopant-rich layer 8 on the bottoms of recesses 6. At the same time, by removing dopant-rich layer 9 from the sidewalls of recesses 6, blocking layer 10 is able to perform its function of eliminating or reducing the diffusion of dopant atoms into the channel region of the MOS device.

Additionally, because the combination of a non-conformal dopant-rich layer 8 (e.g. formed on bottoms only and not on sidewalls) with a blocking layer 10 provides for a less abrupt junction, the energy level required for forming gradient implant region 5 can be reduced relative to a device that does not employ the above-described structure. By reducing the implant energy for forming gradient implant region 5, less surface damage is induced on the substrate 2 during the implant process.

Another advantageous feature of the described embodiments is that by employing the non-conformal profile of dopant-rich layer 8, it is not necessary to process MOS devices, on the one hand, and BJT and rectifier devices, on the other hand, differently. Hence, it is not necessary to protect, or mask, regions 16 and 18, for instance, when forming blocking layer 10. In this way, an extra mask step can be eliminated when integrating MOS and BJT devices on a single substrate, such as for system on chip (SOC) applications.

Various modifications and alternative will be apparent to one skilled in the art when informed by the present disclosure. For instance, while the illustrated embodiments describe n-type doping, the present disclosure applies to p-type doping as well. Likewise, while in situ doped silicon is described, other semiconductor materials, including III-V materials, and compound materials could likewise be employed. While MOS, BJT, and rectifier devices have been described, the present teaching applies equally other devices and device families as well.

What is claimed is:

1. A method for forming a device comprising:
   forming in a substrate a recess having a bottom and sidewalls;
   forming an epitaxial layer over the bottom of the recess;
   forming an epitaxial blocking layer over the epitaxial layer and over the sidewalls of the recess, the epitaxial blocking layer having a different lattice constant than the epitaxial layer; and
   substantially filling the recess with an epitaxially grown material.

2. The method of claim 1 wherein the step of forming an epitaxial layer on the bottom of the recess includes:
   epitaxially growing the epitaxial layer on the bottom and on the sidewalls of the recess; and
   selectively or isotropically removing the epitaxial layer from the sidewalls of the recess.

3. The method of claim 2 wherein selectively removing the epitaxial layer from the sidewalls of the recess includes:
   etching using an etchant gas selected from the group consisting essentially of GeH4, Cl2 and combinations thereof.

4. The method of claim 1 wherein the step of forming an epitaxial layer on the bottom of the recess includes forming an in-situ doped silicon layer using metal oxide chemical vapor deposition (MOCVD).

5. The method of claim 1 wherein the step of forming an epitaxial blocking layer includes forming an in-situ carbon doped silicon layer using MOCVD.

6. The method of claim 1 wherein the step of substantially filling the recess with an epitaxially grown material includes forming an in-situ doped silicon layer using a same dopant as used for the epitaxial layer.

7. The method of claim 1 wherein the epitaxial layer, the epitaxial blocking layer, and the epitaxially grown material are formed in a same chamber.

8. The method of claim 1 wherein the step of forming an epitaxial layer on the bottom of the recess includes in situ doping the epitaxial layer with an impurity selected from the group consisting essentially of phosphorous, antimony, arsenic, and combinations thereof.

9. The method of claim 1 wherein the step of forming an epitaxial blocking layer includes in situ doping the blocking layer with carbon.

10. A device comprising:
    a gate structure formed on a substrate;
    an epitaxial source/drain region formed in the substrate, aligned to the gate structure, and having a bottom surface and a side surface;
    an epitaxial layer interjacent the bottom surface of the epitaxial source/drain region and the substrate; and
    an epitaxial blocking layer interjacent the bottom surface of the epitaxial source/drain region and the epitaxial layer and further interjacent the side surface of the epitaxial source/drain region and the substrate, the epitaxial blocking layer separating the epitaxial layer from the bottom surface of the epitaxial source/drain region and acting as a barrier to diffusion of dopants from the epitaxial source/drain region.

11. The device of claim 10 wherein the epitaxial source/drain region and the epitaxial layer both comprise phosphorous doped silicon.

12. The device of claim 10 wherein the epitaxial blocking layer comprises carbon doped silicon.

13. The device of claim 10 wherein the blocking layer has a thickness of about 70 Å where the blocking layer is interjacent the bottom surface of the epitaxial source/drain region and the epitaxial layer and has a thickness of about 30 Å where the blocking layer is interjacent the side surface of the epitaxial source/drain region and the substrate.

14. The device of claim 10 further comprising a gradient implant region underlying the epitaxial source/drain region and the epitaxial layer.

15. The device of claim 10 further comprising:
    an epitaxial emitter region formed in the substrate and having a bottom surface and a side surface;
    a second epitaxial layer interjacent the bottom surface of the epitaxial emitter region and the substrate; and
    a second epitaxial blocking layer interjacent the bottom surface of the epitaxial emitter region and the epitaxial layer and further interjacent the side surface of the epitaxial emitter region and the substrate.

16. A method of forming a device comprising:
    etching a semiconductor substrate to form at least one recess having a bottom and a sidewall;
    epitaxially growing an in situ doped first layer, doped with a first impurity, over the bottom and the sidewall of the at least one recess;
    removing the in situ doped first layer from the sidewall of the at least one recess, leaving a remaining portion of the first layer over the bottom of the at least one recess;
    epitaxially growing an in situ doped second layer, doped with a second impurity, over the remaining portion of the first layer and over the sidewall of the at least one recess, wherein the second impurity is different than the first impurity; and
    epitaxially growing an in situ doped material, doped with the first impurity, to fill the at least one recess.

17. The method of claim 16 wherein the first impurity is selected from the group consisting of phosphorous, arsenic, and antimony and the second impurity is selected from the group consisting of carbon, germanium, and xenon.

18. The method of claim 17 wherein the at least one recess includes a first recess and a second recess and further comprising forming a metal oxide semiconductor (MOS) transistor using the first recess and forming a bipolar junction transistor (BJT) using the second recess.

19. The method of claim 16 wherein the step of removing the in situ doped first layer from the sidewall of the at least one recess includes an isotropic etch process.

20. The method of claim 16 further comprising:
etching the semiconductor substrate to form a second recess simultaneously with forming the at least one recess;
epitaxially growing the in situ doped first layer on a bottom and a sidewall of the second recess;
selectively removing the in situ doped first layer from the sidewall of the second recess, leaving a remaining portion of the in situ doped first layer on the bottom of the second recess;
epitaxially growing the in situ doped second layer on the remaining portion of the first layer and on the sidewall of the second recess; and
epitaxially growing an in situ doped material to fill the second recess.

\* \* \* \* \*